(12) United States Patent
Sun

(10) Patent No.: US 9,761,759 B2
(45) Date of Patent: Sep. 12, 2017

(54) LIGHT EMITTING MODULE

(71) Applicant: PlayNitride Inc., Tainan (TW)

(72) Inventor: Sheng-Yuan Sun, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/829,627

(22) Filed: Aug. 18, 2015

(65) Prior Publication Data

US 2016/0084484 A1    Mar. 24, 2016

(30) Foreign Application Priority Data

Sep. 23, 2014   (TW) .............. 103132830 A

(51) Int. Cl.
| | |
|---|---|
| F21V 7/04 | (2006.01) |
| H01L 33/36 | (2010.01) |
| H05K 1/14 | (2006.01) |
| H05K 3/00 | (2006.01) |

(52) U.S. Cl.
CPC .............. *H01L 33/36* (2013.01); *H05K 1/14* (2013.01); *H05K 3/0061* (2013.01); *H05K 2201/049* (2013.01); *H05K 2201/10106* (2013.01)

(58) Field of Classification Search
CPC ........ G02B 6/0083; H01L 2224/48227; H05K 2201/10106; H05K 3/303
USPC ........................................ 362/612
See application file for complete search history.

(56) References Cited

U.S. PATENT DOCUMENTS

| | | | |
|---|---|---|---|
| 8,269,911 B2* | 9/2012 | Watanabe ............ | G02B 6/0083 349/58 |
| 9,371,986 B2* | 6/2016 | Nelson ................ | F21V 33/0008 |
| 2012/0050647 A1* | 3/2012 | Chen .................... | G02B 6/0068 362/612 |

FOREIGN PATENT DOCUMENTS

| | | |
|---|---|---|
| TW | 201000799 | 1/2010 |
| TW | M406694 | 7/2011 |

OTHER PUBLICATIONS

"Office Action of Taiwan Counterpart Application", dated Jul. 19, 2016, p. 1-p. 5.

* cited by examiner

*Primary Examiner* — William Carter
(74) *Attorney, Agent, or Firm* — Jianq Chyun IP Office

(57) ABSTRACT

A light emitting module including a plurality of light emitting elements, a plurality of first circuit boards, and a second circuit board is provided. Each of the light emitting elements is disposed on the corresponding first circuit board and is electrically connected to the corresponding first circuit board. The second circuit board is disposed on the first circuit boards, wherein any two adjacent first circuit boards are electrically connected to each other through the second circuit board.

12 Claims, 4 Drawing Sheets

LIGHT EMITTING MODULE

CROSS-REFERENCE TO RELATED APPLICATION

This application claims the priority benefit of Taiwan application serial no. 103132830, filed on Sep. 23, 2014. The entirety of the above-mentioned patent application is hereby incorporated by reference herein and made a part of this specification.

BACKGROUND OF THE DISCLOSURE

1. Field of the Disclosure

The disclosure relates to a light emitting module, and particularly relates to a light emitting module suitable for mass production.

2. Description of Related Art

Due to the global awareness of environmental protection, electronic products that save energy and have lower power consumption have become the mainstream. Taking the illumination industry as an example, since the light emitting efficiency and lifetime of light emitting diodes (LEDs) have been improved, and the LEDs are advantageous in having lower power consumption, higher efficiency, faster responding speed, smaller size, and lighter weight and causing less pollution, the LEDs are now important products on the market.

Recently, the needs for light emitting modules with higher power and more concentrated light intensity are growing. In addition to improvement on the structure of LEDs, the way that the light emitting modules are packaged is also key factors to the brightness, illumination uniformity, and device lifespan of the LEDs. In the conventional technology, a plurality of LED chips are usually disposed on a plurality of circuit boards, wherein the LED chips are respectively electrically connected to the corresponding circuit boards. However, the circuit boards are electrically insulated from each other. To allow the LED chips to be electrically connected in parallel, serial, or serial-parallel, two adjacent circuit boards are usually electrically connected through wiring, so that the LED chips are connected in parallel, series, or series-parallel. However, the rate of wiring and the yield of the wiring process have been two major factors that make mass production difficult and the manufacturing cost unable to be reduced effectively.

SUMMARY OF THE DISCLOSURE

The disclosure provides a light emitting module suitable for mass production and having higher reliability.

The disclosure provides a light emitting module including a plurality of light emitting elements, a plurality of first circuit boards, and a second circuit board. Each of the light emitting elements is disposed on the corresponding first circuit board and electrically connected to the corresponding first circuit board. The second circuit board is disposed on the first circuit boards. Any two adjacent first circuit boards are electrically connected to each other through the second circuit board.

According to an embodiment of the disclosure, each of the light emitting elements has a front surface and two electrodes located on the front surface. Each of the light emitting elements is disposed on the corresponding first circuit board with the front surface, and electrically connected to the corresponding first circuit board through the two electrodes.

According to an embodiment of the disclosure, each of the first circuit boards has a first circuit layer facing the front surface of the corresponding light emitting element. The first circuit layer has a first pad and a second pad that are electrically opposite pads. One of the two electrodes is electrically connected to the first pad, while the other of the two electrodes is electrically connected to the second pad.

According to an embodiment of the disclosure, the second circuit board has a first surface, a second surface opposite to the first surface, and a second circuit layer located on the first surface. The second circuit board is disposed on the first circuit boards with the first surface, and any two adjacent first circuit boards are electrically connected to each other through the second circuit layer.

According to an embodiment of the disclosure, the first pad of one of the any two adjacent first circuit boards is electrically connected to the second pad of the other of the any two adjacent first circuit boards through the second circuit layer.

According to an embodiment of the disclosure, the second circuit layer has two third pads and a plurality of fourth pads between the third pads, the $n^{th}$ fourth pad and the $(n+1)^{th}$ fourth pad are electrically connected to each other. The first pad of one of the any two adjacent first circuit boards is electrically connected to the second pad of the other of the any two adjacent first circuit boards through the $n^{th}$ and the $(n+1)^{th}$ fourth pads of the second circuit layer, and n is an odd number.

According to an embodiment of the disclosure, the second circuit board further includes at least two conductive vias penetrating the first surface and the second surface and a third circuit layer located on the second surface. The second circuit layer is electrically connected to the third circuit layer through the corresponding conductive via.

According to an embodiment of the disclosure, the light emitting module further includes a carrier. The first circuit boards are disposed on the carrier.

According to an embodiment of the disclosure, the carrier has a carrying portion at a side away from the first circuit boards, and the second circuit board is disposed on the carrier portion.

According to an embodiment of the disclosure, a carrying surface of the carrying portion where the second circuit board is disposed and upper surfaces of the first circuit boards where the second circuit board is disposed are coplanar.

According to an embodiment of the disclosure, the light emitting module further includes a third circuit board located at a side away from the first circuit boards. The second circuit board is disposed on the third circuit board and the first circuit boards, and any two adjacent first circuit boards are electrically connected to the third circuit board through the second circuit board.

According to an embodiment of the disclosure, the light emitting module further includes a carrier. The first circuit boards and the third circuit board are disposed on the carrier.

According to an embodiment of the disclosure, an upper surface of the third circuit board where the second circuit board is disposed and upper surfaces of the first circuit boards where the second circuit board is disposed are coplanar.

Based on above, in the light emitting module of the disclosure, the light emitting elements are respectively disposed on the first circuit boards, and the first circuit boards are electrically connected through the second circuit board, such that each of the light emitting elements on the first circuit board may be electrically connected in parallel, in serial, or in serial-parallel. Thus, compared with the conventional technology that performs a wiring process to electrically connect a plurality of circuit boards having a plurality of light emitting elements, the light emitting module of the disclosure is not only easier to manufacture, suitable for mass production and has higher reliability, but also has lower manufacturing cost.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
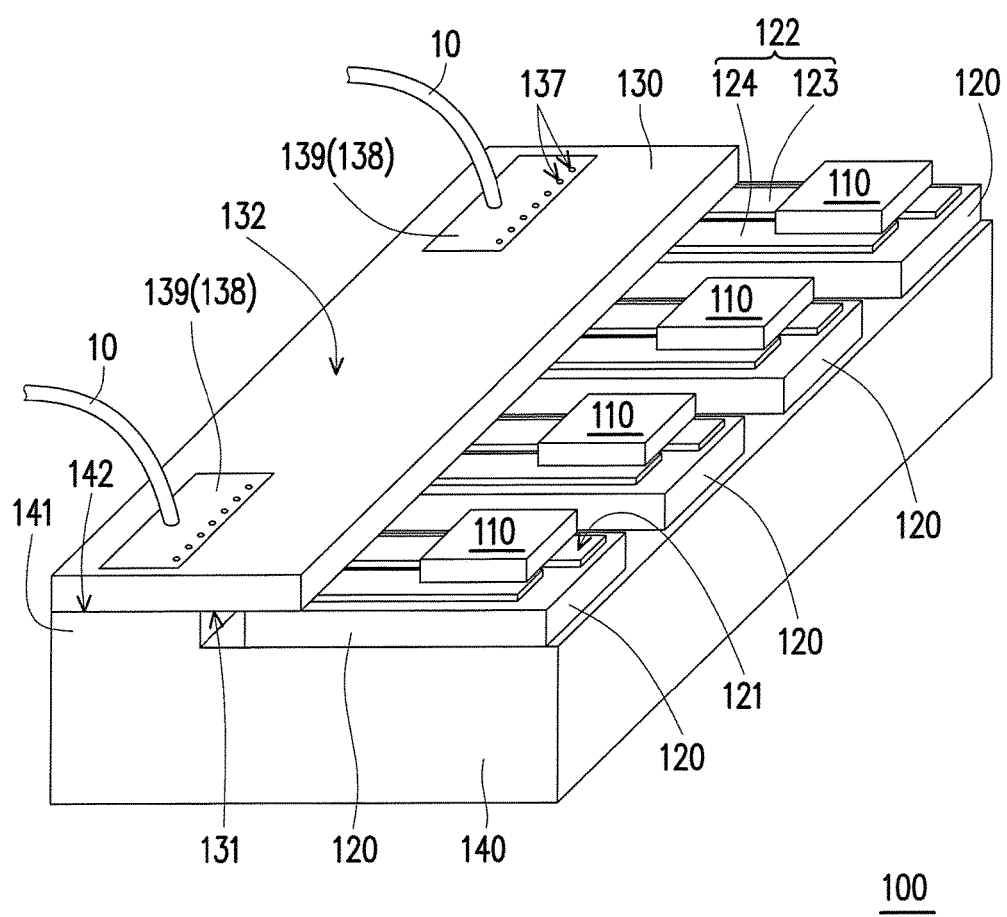
FIG. 1 is a schematic view illustrating a light emitting module according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
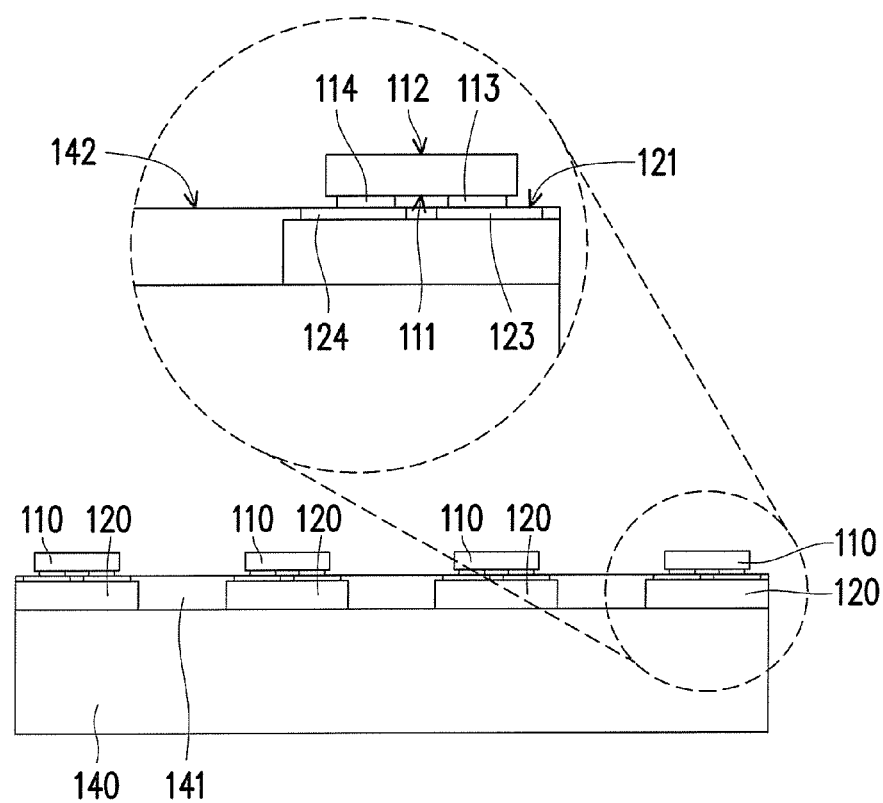
FIG. 2 is a side view illustrating the light emitting module of FIG. 1.

FIG. 1 is a schematic view illustrating a light emitting module according to an embodiment of the disclosure. FIG. 2 is a side view illustrating the light emitting module of FIG. 1. For the ease of illustration, FIG. 2 omits the second circuit board 130. Referring to FIGS. 1 and 2, in this embodiment, a light emitting module 100 includes a plurality of light emitting elements 110, a plurality of first circuit boards 120, and a second circuit board 130. The light emitting elements 110 are horizontal light emitting diode chips or flip-chip light emitting diode chips, for example, and the first circuit board 120 and the second circuit board 130 may be a FR-4 printing circuit board, a FR-5 printed circuit board, a silicon substrate, a ceramic substrate, or a metal substrate. However, the disclosure is not limited thereto.

Each of the light emitting elements 110 has a front surface 111, and a first electrode 113 and a second electrode 114 located on the front surface 111. Each of the light emitting elements 110 is disposed on the corresponding first circuit board 120 with the front surface 111. In other words, each of the first circuit boards 120 may carry the second circuit board 130, and an upper surface 121 of each of the first circuit boards 120 may face the front surface 111 of each of the light emitting elements 110. Generally speaking, the light emitting element 110 may include a P-type semiconductor layer (not shown), a light emitting layer (not shown), an N-type semiconductor layer (not shown), and a base material (not shown). The N-type semiconductor layer (not shown) is disposed on the base material (not shown), the light emitting layer (not shown) is disposed on a partial area of the N-type semiconductor layer (not shown), and the P-type semiconductor layer (not shown) is disposed on the light emitting layer (not shown). One of the first electrode 113 and the second electrode 114 is electrically connected to the N-type semiconductor layer (not shown) not covered by the light emitting layer (not shown), and the other of the first electrode 113 and the second electrode 114 is electrically connected to the P-type semiconductor layer (not shown). In addition, the P-type semiconductor layer (not shown) and the N-type semiconductor layer (not shown) may respectively be compound semiconductor epitaxial layers formed by Group III-V elements. The light emitting layer (not shown) is also called active layer. When a forward bias is applied to the first electrode 113 and the second electrode 114, the light emitting layer (not shown) may emit light.

Specifically, each of the first circuit boards 120 has a first circuit layer 122 facing the front surface 111 of the corresponding light emitting element 110. The first circuit layer 122 may have a first pad 123 and a second pad 124 electrically opposite to each other. Here, each of the light emitting elements 110 is electrically connected to the first pad 123 of the corresponding first circuit board 120 with the first electrode 113, and electrically connected to the second pad 124 of the corresponding first circuit board 120 with the second electrode 114, for example. However, the disclosure is not limited thereto. In other embodiments, each of the light emitting elements 110 may also be electrically connected to the first pad 123 of the corresponding first circuit board 120 with the second electrode 114, while electrically connected to the second pad 124 of the corresponding first circuit board 120 with the first electrode 113.

Generally speaking, each of the light emitting elements 110 is disposed on an upper surface 121 of the corresponding first circuit board 120 through flip-chip bonding or by using a conductive adhesive (not shown), so as to be electrically connected to the first circuit layer 122 of the corresponding first circuit board 120. Besides, the second circuit board 130 is disposed on the upper surfaces 121 of the first circuit board 120. Any two adjacent first circuit boards 120 may be electrically connected to each other through the second circuit board 130.

Figure 3:
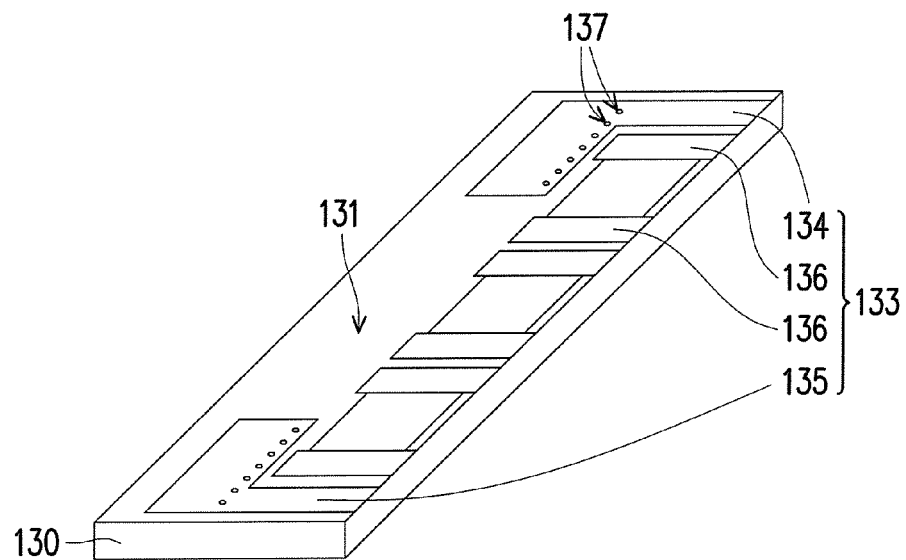
FIG. 3 is a bottom view of the second circuit board of FIG. 1.

FIG. 3 is a bottom view of the second circuit board of FIG. 1. Referring to FIGS. 1-3, in this embodiment, the second circuit board 130 may have a first surface 131, a second surface 132 opposite to the first surface 131, and a second circuit layer 133 located on the first surface 131. The second circuit board 130 is disposed on the first circuit boards 120 by making the first surface 131 and the upper surfaces 121 of the first circuit boards 121 face each other, and any two adjacent first circuit boards 120 are electrically connected to each other through the second circuit layer 133. More specifically, through the second circuit layer 133, the first pad 123 of one of the any two adjacent first circuit boards 120 is electrically connected to the second pad 124 of the other of the any two adjacent first circuit boards 120.

Specifically, the second circuit layer 133 has two third pads 134 and 135, and a plurality of fourth pads 136 between the third pads 134 and 135. The third pads 134 and 135 are electrically isolated from the fourth pads 136, the $n^{th}$ fourth pad 136 and the $(n+1)^{th}$ fourth pad 136 are electrically connected to each other, and n is an odd number. In this configuration, when the second circuit board 130 covers the upper surfaces 121 of the first circuit boards 120 with the first surface 131 of the second circuit board 130, the second circuit board 130 may allow the first pad 123 of one of the any two adjacent first circuit boards 120 to be electrically connected to the second pad 124 of the other of the any two adjacent first circuit boards 120 through the n$^{th}$ fourth pad 136 and the (n+1)$^{th}$ fourth pad 136, and n is an odd number.

Furthermore, the second circuit board 130 further has at least two conductive vias 137 (schematically shown as plural in the drawings) penetrating the first surface 131 and the second surface 132, and a third circuit layer 138 located on the second surface 132. The second circuit layer 133 is electrically connected to the third circuit layer 138 through the conductive vias 137. Specifically, two of the first circuit boards 120 that are not electrically connected each other through the n$^{th}$ fourth pad 136 and the (n+1)$^{th}$ fourth pad 136 may be electrically connected to each other through the third pads 134 and 135, for example, and n is an odd number. Here the first pad 123 of one of the two first circuit boards 120 is electrically connected to the third pad 134, and the second pad 124 of the other of the two first circuit boards 120 is electrically connected to the third pad 135. Generally speaking, the electrical connection between the circuit layers is achieved by performing a soldering process, for example.

As shown in FIG. 1, the third circuit layer 138 may include two pads 139. In addition, each of the pads 139 is suitable to be connected to an external voltage (not shown) through a circuit 10, and a forward bias is applied to the first electrode 113 and the second electrode 114 of each of the light emitting elements 110 through a circuit formed by the third circuit layer 138 of the second circuit board 130, the conductive vias 137 of the second circuit board 130, the second circuit layer 133 of the second circuit board 130, and the first circuit layer 122 of each of the first circuit boards 120.

In this embodiment, the light emitting module 100 further includes a carrier 140. The first circuit boards 120 are disposed on the carrier 140, and fixed to the carrier 140 by adopting the surface mounting technology (SMT), for example. However, the disclosure is not limited thereto. In general, the carrier 140 may be a heat-dissipating base formed of a metallic material, a ceramic material, or other suitable heat-dissipating materials. Thus, the heat generated from the light emitting elements 110 when the light emitting elements 110 are being operated may be discharged to the external environment through the carrier 140. In this way, the light emitting elements 110 have preferable light emitting efficiency, and do not malfunction or be damaged due to overly high working temperature. Thus, the lifetime thereof is able to be elongated.

Specifically, the carrier 140 may have a carrying portion 141 at a side away from the first circuit boards 120, and the second circuit board 130 is disposed on the carrying portion 141. In addition, the second circuit board 130 is fixedly disposed on the carrier 140 by adopting the surface mounting technology (SMT) or screw-locking, for example. However, the disclosure is not limited thereto. Here, a carrying surface 142 of the carrying portion 141 where the second circuit board 130 is disposed and the upper surfaces 121 of the first circuit boards 120 where the second circuit board 130 is disposed are coplanar, such that the second circuit board 130 may be horizontally and fixedly disposed on the first circuit boards 120, and the electrical connection between the second circuit board 130 and the first circuit boards 120 may not be incomplete due to tilting. Thus, the reliability is increased.

In brief, in the light emitting module 100 of this embodiment, the first circuit boards 120 may be electrically connected through the second circuit board 130, such that the light emitting elements 110 on the first circuit boards 120 may be electrically connected in parallel, in serial, or in serial-parallel. Thus, the light emitting module 100 of this embodiment is suitable for mass production and has higher reliability, and the manufacturing cost thereof is also lower.

In the following, other embodiments are provided for further description. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 4:
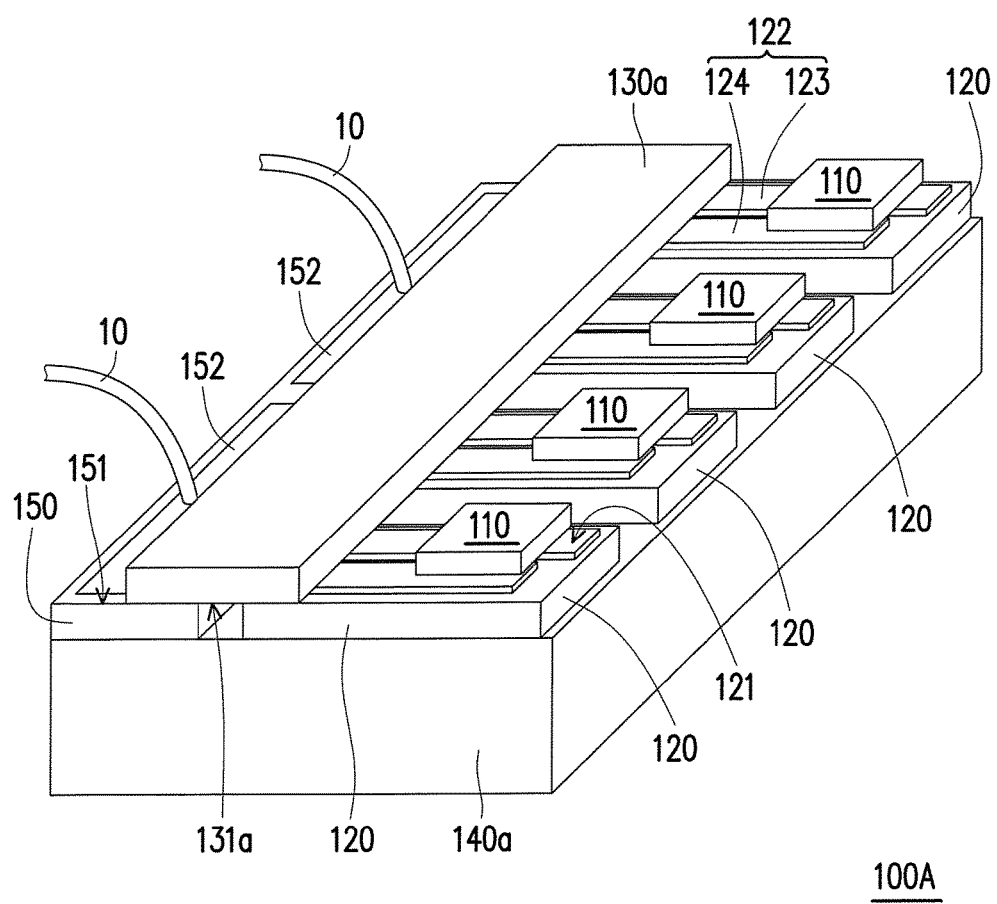
FIG. 4 is a schematic view illustrating a light emitting module according to another embodiment of the disclosure.
Figure 5:
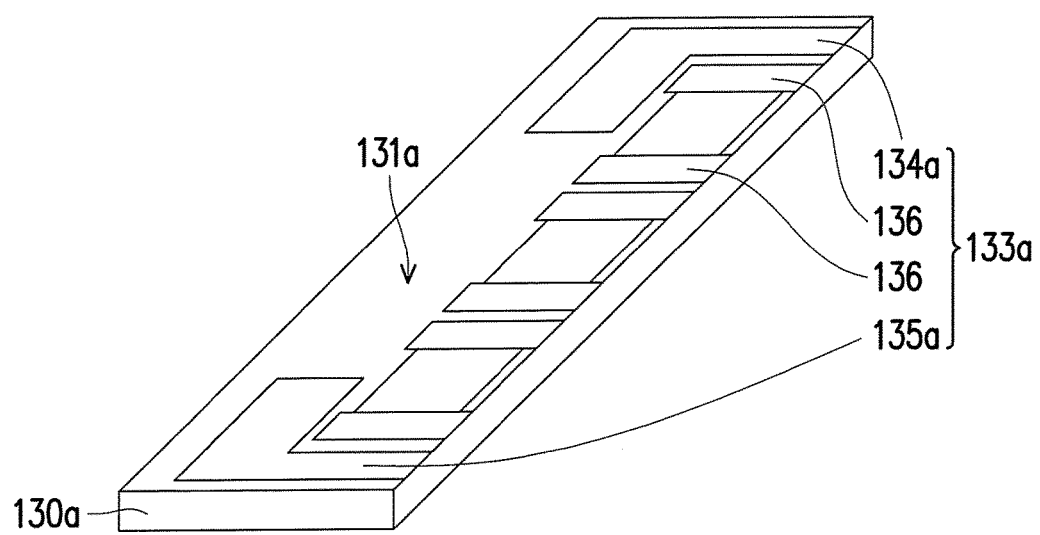
FIG. 5 is a bottom view of the second circuit board of FIG. 4.

FIG. 4 is a schematic view illustrating a light emitting module according to another embodiment of the disclosure. FIG. 5 is a bottom view of the second circuit board of FIG. 4. Referring to FIGS. 4 and 5, a light emitting module 100A is substantially similar to the light emitting module 100, except for a main difference that the light emitting module 100A further includes a third circuit board 150 at a side away from the first circuit boards 120. In other words, the second circuit board 130a is disposed on the third circuit board 150 and the first circuit boards 120, for example. An upper surface 151 of the third circuit board 130 and the upper surface 121 of the second circuit board 130a are substantially coplanar. Thus, a carrier 140a may omit the carrying portion 141 in the previous embodiment. However, the disclosure is not limited thereto.

Besides, since the second circuit board 130a only has a second circuit layer 133a on a first surface 131a, after a second circuit board 130a is disposed on the third circuit board 150 and the first circuit boards 120 with the first surface 131a, two of the first circuit boards 120 that are not electrically connected to each other through the n$^{th}$ fourth pad 136 and the (n+1)$^{th}$ fourth pad 136 may be respectively electrically connected to two pads 152 of the third circuit board 150 through third pads 134a and 135a of the second circuit layer 133a, and n is an odd number. Here, each of the pads 152 is suitable to be connected to an external voltage (not shown) through the circuit 10. In addition, a forward bias is applied to the first electrode 113 and the second electrode 114 of each of the light emitting elements 110 through a circuit formed by the second circuit layer 133a of the second circuit board 130a and the first circuit layer 122 of each of the first circuit boards 120.

Based on above, in the light emitting module of the disclosure, the light emitting elements are respectively disposed on the first circuit boards, and the first circuit boards are electrically connected through the second circuit board, such that the light emitting elements may be electrically connected in parallel, in serial, or in serial-parallel. Thus, compared with the conventional technology that performs a wiring process to electrically connect a plurality of circuit boards having a plurality of light emitting elements, the light emitting module of the disclosure is not only suitable for mass production and has higher reliability, but also has lower manufacturing cost.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light emitting module, comprising:
   a plurality of light emitting elements, wherein each of the light emitting elements has a front surface;

a plurality of first circuit boards, wherein the front surface of each of the light emitting elements is disposed and faced on the corresponding first circuit board and electrically connected to the corresponding first circuit board through two electrodes of each of the light emitting elements, wherein the two electrodes are disposed between the corresponding first circuit board and the front surface of each of the light emitting elements; and a second circuit board, disposed on a same side of the first circuit boards with the plurality of light emitting elements, wherein any two adjacent first circuit boards are electrically connected to each other through the second circuit board, each of the first circuit boards has a first circuit layer, the light emitting elements and the second circuit board are disposed on a same side of the first circuit layers, and the light emitting elements and the second circuit board respectively cover and contact two opposite end portion of the first circuit layers.

2. The light emitting module as claimed in claim 1, wherein each of first circuit layers faces the front surface of the corresponding light emitting element, the first circuit layer has a first pad and a second pad that are electrically opposite pads, one of the two electrodes is electrically connected to the first pad, while the other of the two electrodes is electrically connected to the second pad.

3. The light emitting module as claimed in claim 2, wherein the second circuit board has a first surface, a second surface opposite to the first surface, and a second circuit layer located on the first surface, the second circuit board is disposed on the first circuit boards with the first surface, and any two adjacent first circuit boards are electrically connected to each other through the second circuit layer.

4. The light emitting module as claimed in claim 3, wherein the first pad of one of the any two adjacent first circuit boards is electrically connected to the second pad of the other of the any two adjacent first circuit boards through the second circuit layer.

5. The light emitting module as claimed in claim 4, wherein the second circuit layer has two third pads and a plurality of fourth pads between the third pads, the $n^{th}$ fourth pad and the $(n+1)^{th}$ fourth pad are electrically connected to each other, the first pad of one of the any two adjacent first circuit boards is electrically connected to the second pad of the other of the any two adjacent first circuit boards through the $n^{th}$ and the $(n+1)^{th}$ fourth pads of the second circuit layer, and n is an odd number.

6. The light emitting module as claimed in claim 3, wherein the second circuit board further comprises at least two conductive vias penetrating the first surface and the second surface and a third circuit layer located on the second surface, and the second circuit layer is electrically connected to the third circuit layer through the corresponding conductive via.

7. The light emitting module as claimed in claim 1, further comprising:
   a carrier, wherein the first circuit boards are disposed on the carrier.

8. The light emitting module as claimed in claim 7, wherein the carrier has a carrying portion at a side away from the first circuit boards, and the second circuit board is disposed on the carrying portion.

9. The light emitting module as claimed in claim 8, wherein a carrying surface of the caning portion where the second circuit board is disposed and upper surfaces of the first circuit boards where the second circuit board is disposed are coplanar.

10. The light emitting module as claimed in claim 1, further comprising:
    a third circuit board, located at a side away from the first circuit boards, wherein the second circuit board is disposed on the third circuit board and the first circuit boards, and any two adjacent first circuit boards are electrically connected to the third circuit board through the second circuit board.

11. The light emitting module as claimed in claim 10, further comprising:
    a carrier, wherein the first circuit boards and the third circuit board are disposed on the carrier.

12. The light emitting module as claimed in claim 10, wherein an upper surface of the third circuit board where the second circuit board is disposed and upper surfaces of the first circuit boards where the second circuit board is disposed are coplanar.

* * * * *